United States Patent [19]

Cho

[11] Patent Number: 6,104,323
[45] Date of Patent: Aug. 15, 2000

[54] DATA COMPRESSION APPARATUS FOR COMPENSATING A DEVIATION OF A COMPRESSION RATE

[75] Inventor: Sung-Ryul Cho, Seoul, Rep. of Korea

[73] Assignee: Daewoo Electronics Co., Ltd., Seoul, Rep. of Korea

[21] Appl. No.: 09/210,930

[22] Filed: Dec. 15, 1998

[30] Foreign Application Priority Data

Dec. 20, 1997 [KR] Rep. of Korea ............ 97-71298

[51] Int. Cl.$^7$ ................................. H03M 7/38
[52] U.S. Cl. ................................. 341/51; 341/50
[58] Field of Search .................. 341/50, 51, 95, 341/106, 87

[56] References Cited

U.S. PATENT DOCUMENTS

| | | | |
|---|---|---|---|
| 5,179,138 | 1/1993 | Ranganathan et al. ............ | 341/51 |
| 5,406,278 | 4/1995 | Graybill et al. ............ | 341/51 |
| 5,440,753 | 8/1995 | Hou et al. ............ | 711/108 |
| 5,525,982 | 6/1996 | Cheng et al. ............ | 341/51 |
| 5,703,581 | 12/1997 | Matias et al. . | |
| 5,886,652 | 3/1999 | Adachi et al. ............ | 341/67 |
| 6,026,198 | 2/2000 | Okada ............ | 382/247 |

FOREIGN PATENT DOCUMENTS 5113869  5/1993  Japan .

*Primary Examiner*—Peguy JeanPierre
*Attorney, Agent, or Firm*—Pennie & Edmonds LLP

[57] ABSTRACT

In a data compression apparatus for compensating a deviation of a compression rate of an input stream of characters (ISC's), a candidate string matching (CSM) circuit, based on codewords (CD's) in a CD dictionary, performs a CSM on the ISC's to provide a first maximum length candidate string (MLCS) and a second MLCS immediately following the first MLCS. A candidate string (CS) storing circuit, based on the CD dictionary, the first MLCS and the second MLCS, generates derived CS pairs (DCSP's) to thereby store a DCSP table listing the DCSP's. A compression rate deviation (CRD) evaluation circuit evaluates a CRD between the first MLCS and the second MLCS, thereby providing the first MLCS and the second MLCS as a first string and a second string, respectively, if a first predetermined CRD evaluation criterion (PCRDEC) is satisfied; and supplying a reduction string matching (RSM) command signal if otherwise. An RSM circuit, in response to the RSM command signal, performs an RSM based on the DCSP table to select a DCSP as a selected DCSP having a first string and a second string, wherein a CRD between the first string and the second string satisfies a second PCRDEC. An encoder encodes first and second CD's corresponding to the first and second string's to thereby generate encoded first and second CD's, respectively.

20 Claims, 6 Drawing Sheets

| INPUT STREAM OF CHARACTERS | ... abcdef ... |
|---|---|
| FIRST MLCS | abc |
| SECOND MLCS | de |

| INPUT STREAM OF CHARACTERS | ... abcdefghijklm ... |
|---|---|
| FIRST MLCS | abcdef |
| SECOND MLCS | gh |

| INPUT STREAM OF CHARACTERS | ... abcdefghij ... |
|---|---|
| FIRST MLCS | ab |
| SECOND MLCS | cdefgh |

| | FIRST DCS | SECOND DCS |
|---|---|---|
| DCSP1 | abcde | fgh |
| DCSP2 | abcd | efgh |

| | FIRST DCS | SECOND DCS |
|---|---|---|
| DCSP1 | ab | cdefghi |
| DCSP2 | abc | defghi |
| DCSP3 | abcd | efghi |

| INPUT STREAM OF CHARACTERS | ... abcdefghijkl ... |
|---|---|
| PREVIOUS STRING | a |
| MLCS | bcde |
| CURRENT STRING | bcd |

| INPUT STREAM OF CHARACTERS | ... abcdefghijkl ... |
|---|---|
| PREVIOUS STRING | bcd |
| MLCS | ef |
| CURRENT STRING | ef |

| CODEWORD | CANDIDATE STRING |
|---|---|
| 4 | bcde |
| 3 | bcd |
| 2 | bc |
| 1 | b |

DATA COMPRESSION APPARATUS FOR COMPENSATING A DEVIATION OF A COMPRESSION RATE

FIELD OF THE INVENTION

The present invention relates to a data compression apparatus; and, more particularly, to a data compression apparatus for compensating a deviation of a compression rate.

BACKGROUND OF THE INVENTION

Since the available frequency bandwidth of a conventional transmission channel is limited in digitally televised systems, in order to transmit the large amount of digital data therethrough, it is necessary to compress or reduce the volume of data through the use of various data compression techniques.

Although many different classes of data compression techniques are known in the art, one of the most useful is the class of dictionary-based universal compression techniques. Among these, the most widely used is a standard coding algorithm, e.g., CCITT (International Telegraph and Telephone Consultative Committee) V.42bis, established by CCITT, wherein the standard coding algorithm is developed as a practical technique for compressing data based on the so-called Ziv-Lempel coding algorithm.

In the CCITT V.42bis, an encoding and a decoding apparatus are provided, each having a fixed, finite amount of memory as a codeword storing circuit. This memory, also referred to as a "dictionary", is adapted to contain a finite number of codewords corresponding to strings of characters. Each string has a unique codeword associated therewith. Dictionaries in the encoding apparatus and the decoding apparatus may be initialized at the beginning to contain identical information.

In a conventional data compression or encoding apparatus to encode an input stream of characters, e.g., alphabets, employing a conventional string matching technique, if the input stream of characters is inputted thereto on a character-by-character basis, a longest matched string of characters, i.e., a maximum length string, is matched with one of a plurality of codewords or pointers within a dictionary thereof.

In other words, the conventional string matching technique includes a step of parsing an input stream of characters into parsed strings, wherein each parsed string is a longest matched string of characters.

Specifically, a string, i.e., a sequence of characters, is formed from a first character and, if the string matches with a codeword of the dictionary, then a next character will be read and appended to the string to repeat this step.

If there is no codeword that matches with the string in the dictionary, the last character appended to the string will be removed to generate a longest matched string of characters, wherein the string shortened represents the longest matched string and the last character represents an unmatched character.

Then, the conventional encoding apparatus detects a codeword corresponding to the longest matched string within the dictionary and then encodes the codeword to thereby provide an encoded codeword.

It should be noted that the conventional encoding apparatus may include a codeword updating circuit. The codeword updating circuit deletes codewords corresponding to insignificant strings from the dictionary, so as to provide the dictionary with room for storing codewords corresponding to frequently occurring strings of characters, wherein the insignificant strings are selected among infrequently used strings.

Lengths of consecutive strings generated by the conventional encoding apparatus are independent of each other. A compression rate for a string can be characterized by a corresponding character length of the string. Hence, there frequently occurs a great deviation or difference of compression rates between consecutive strings in the conventional encoding apparatus.

Therefore, as deviations of compression rates for consecutive strings accumulate, the so-called overflow effect of encoded codewords becomes severe at an output end of the encoder in the conventional encoding apparatus, thereby deteriorating the transmission efficiency thereof.

SUMMARY OF THE INVENTION

It is, therefore, a primary object of the present invention to provide a data compression apparatus for compensating or decreasing a deviation of a compression rate between consecutive strings of characters to thereby enhance the transmission efficiency thereof.

In accordance with one aspect of the present invention, there is provided a data compression apparatus for compensating a deviation of a compression rate of an input stream of characters, comprising: a codeword storing circuit for storing a codeword corresponding to a string of characters to thereby provide a codeword dictionary having a plurality of different codewords for strings, wherein each codeword identifies a corresponding one of the strings; a candidate string matching circuit, based on the codewords in the codeword dictionary, for performing a candidate string matching on the input stream of characters in accordance with a predetermined string matching technique to thereby provide a first maximum length candidate string (MLCS) and a second MLCS followed after the first MLCS, wherein each of the first and second MLCS's is a candidate string having a longest character length thereof among all of the candidate strings having corresponding codewords in the codeword dictionary, respectively; a candidate string storing circuit, based on the codeword dictionary, the first MLCS and the second MLCS, for generating derived candidate string pairs (DCSP's) to thereby store a DCSP table listing the DCSP's, each DCSP having a first derived candidate string (DCS) and a second DCS, said each DCSP being generated in accordance with a predetermined DCSP generation rule; a compression rate deviation (CRD) evaluation circuit for evaluating a CRD between the first MLCS and the second MLCS, thereby providing the first MLCS and the second MLCS as a first string and a second string, respectively, if a first predetermined CRD evaluation criterion is satisfied; and supplying a reduction string matching command signal if the first predetermined CRD evaluation criterion is not satisfied; and a reduction string matching circuit, in response to the reduction string matching command signal, for performing a reduction string matching based on the DCSP table to thereby select a DCSP as a selected DCSP having a first string and a second string among the DCSP's listed in the DCSP table, wherein a CRD between the first string and the second string of the selected DCSP satisfies a second predetermined CRD evaluation criterion.

In accordance with another aspect of the present invention, there is provided a data compression apparatus for compensating a deviation of a compression rate of an input stream of characters, comprising: a codeword storing circuit for storing a codeword corresponding to a string of characters to thereby provide a codeword dictionary having a plurality of different codewords for strings, wherein each codeword identifies a corresponding one of the strings; a previous string storing circuit for storing a previous string to thereby provide the previous string; a candidate string matching circuit, based on the codewords in the codeword dictionary and a previous string, for performing a candidate string matching on the input stream of characters in accordance with a predetermined string matching technique to thereby provide candidate strings and a maximum length candidate string (MLCS), wherein each candidate string is a string having a corresponding codeword in the codeword dictionary and the MLCS is a candidate string having a longest character length thereof among all of the candidate strings; a candidate string storing circuit, based on the candidate strings with reference to the codeword dictionary, for storing the candidate strings and codewords corresponding thereto, thereby generating a candidate string table listing the candidate strings and the codewords corresponding thereto; a compression rate deviation (CRD) evaluation circuit for evaluating a CRD between the MLCS and the previous string, thereby providing the MLCS as a current string if a predetermined CRD evaluation criterion is satisfied and supplying the MLCS and the previous string if the predetermined CRD evaluation criterion is not satisfied; and a reduction string matching circuit, based on the MLCS and the previous string with reference to the candidate string table, for performing a reduction string matching to select an optimum candidate string among the candidate strings listed in the candidate string table in accordance with a predetermined optimum candidate string selection rule, thereby providing the optimum candidate string as a current string.

BRIEF DESCRIPTION OF THE DRAWINGS

The above and other objects and features of the present invention will become apparent from the following description of preferred embodiments given with reference to the accompanying drawings, in which:

FIGS. 3A to 3C set forth tables for use in describing the operation of the data compression apparatus shown in FIG. 1;

FIGS. 4A and 4B illustrate tables for use in describing the operation of the candidate string storing circuit shown in FIG. 1;

FIGS. 5A and 5B depict tables for use in describing the operation of the data compression apparatus represented in FIG. 2; and FIG. 6 presents a candidate string table generated by the candidate string storing circuit represented in FIG. 2.

DETAILED DESCRIPTION OF THE PREFERRED EMBODIMENTS

Figure 1:
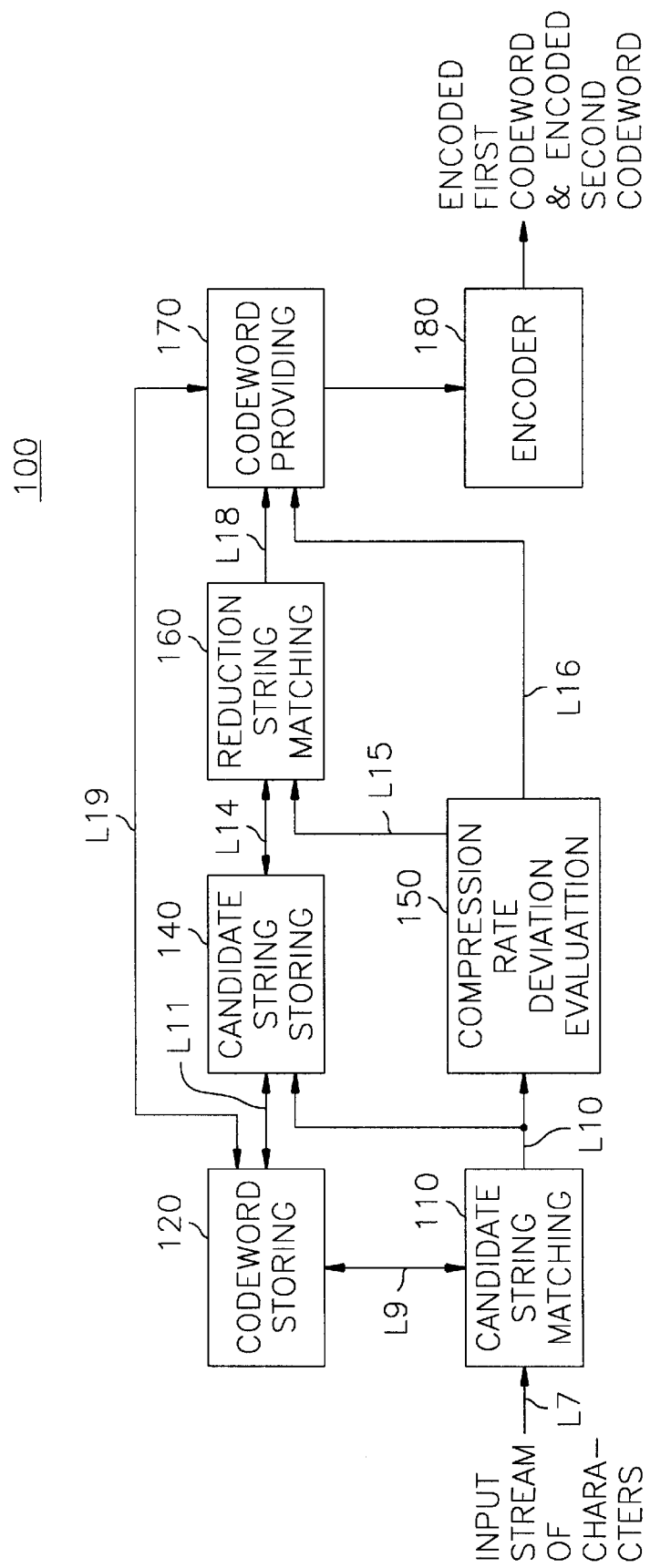
FIG. 1 shows a block diagram of a data compression apparatus for compensating a deviation of a compression rate of an input stream of characters in accordance with a preferred embodiment of the present invention.

Referring to FIG. 1, there is shown a block diagram of a data compression apparatus 100 for compensating a deviation of a compression rate of an input stream of characters in accordance with a preferred embodiment of the present invention.

The apparatus 100 comprises a candidate string matching circuit 110, a codeword storing circuit 120, a candidate string storing circuit 140, a compression rate deviation (CRD) evaluation circuit 150, a reduction string matching circuit 160, a codeword providing circuit 170 and an encoder 180.

In the apparatus 100, an input stream of characters, e.g., alphabets, is first fed to the candidate string matching circuit 110 via a line L7. The codeword storing circuit 120 stores a codeword corresponding to a string of characters to thereby provide a codeword dictionary having a plurality of different codewords for strings, wherein each codeword identifies a corresponding one of the strings.

The candidate string matching circuit 110, based on the codewords in the codeword dictionary accessible through a line L9, performs a candidate string matching on the input stream of characters in accordance with a predetermined string matching technique to thereby provide a first maximum length candidate string (MLCS) and a second MLCS immediately following the first MLCS to the candidate string storing circuit 140 and the CRD evaluation circuit 150 via a line L10.

It should be noted that each candidate string is a string having a corresponding codeword in the codeword dictionary; and each of the first MLCS and the second MLCS is a candidate string having a longest character length thereof among all of the candidate strings.

It should also be noted that in accordance with the predetermined string matching technique, in case that there is no codeword in the codeword dictionary for a starting character of each of the first candidate string and the second candidate string, the candidate string matching circuit 110 registers a codeword corresponding to the starting character into the codeword dictionary through the line L9 to thereby provide an updated codeword dictionary having the codeword corresponding thereto as the codeword dictionary.

The candidate string storing circuit 140, based on the codeword dictionary accessible via a line L11 and the first MLCS and the second MLCS fed thereto from the candidate string matching circuit 110, generates derived candidate string pairs (DCSP's) and then stores a DCSP table listing the DCSP's, wherein each DCSP has a first derived candidate string (DCS) and a second DCS; and the DCSP's are generated in accordance with a predetermined DCS generation rule.

In accordance with the predetermined DCS generation rule, a DCSP generation process is first applied to the first MLCS and the second MLCS by the candidate string storing circuit 140 as a DCSP table storing circuit.

In detail, the candidate string storing circuit 140 evaluates lengths of the first MLCS and the second MLCS. Then, if a length of the first MLCS is equal to or longer than that of the second MLCS, the candidate string storing circuit 140 generates a first DCSP DCSP1 having a first DCS and a second DCS, wherein the first DCS is obtained by deleting the last character of the first MLCS; and the second DCS is obtained by attaching the last character of the first MLCS to the second MLCS as a first character thereof.

Thereafter, in the candidate string storing circuit 140, the same DCSP generation process applied to the first MLCS and the second MLCS described above is applied to the first DCS and the second DCS to thereby generate a new DCSP, e.g., a second DCSP DCSP2 including a first DCS and a second DCS.

Meanwhile, if a length of the first MLCS is shorter than that of the second MLCS, the candidate string storing circuit 140 generates a first DCSP DCSP1 having a first DCS and a second DCS, wherein the first DCS is obtained by attaching the first character of the second MLCS to the first MLCS as a last character thereof and the second DCS is obtained by deleting the first character of the second MLCS.

Thereafter, the same DCSP generation process applied to the first MLCS and the second MLCS described just above is applied to the first DCS and the second DCS to thereby generate a new DCSP, e.g., a second DCSP DCSP2 including a first DCS and a second DCS.

In accordance with a preferred embodiment of the present invention, the above mentioned DCSP generation process is repeatedly applied to the first DCS and the second DCS obtained just before thereof until a final DCSP is obtained.

It should be noted that the final DCSP has a first DCS and a second DCS, the length of the first DCS of the final DCSP being equal to that of the second DCS thereof if the total number of characters of the first MLCS and the second MLCS is an even number; and if otherwise, the length of the first DCSP thereof being shorter than that of the second DCS thereof by 1.

For example, referring to FIGS. 4A and 4B, there are illustrated tables 410 and 430 for use in describing the operation of the candidate string storing circuit 140 shown in FIG. 1.

In FIG. 4A, if the first MLCS and the second MLCS are assumed to be "abcdef" and "gh", respectively, the DCSP1 has "abcde" and "fgh" as its first DCS and second DCS, respectively; the DCSP2, as a final DCSP, has "abcd" and "efgh" as its first DCS and second DCS, respectively.

In FIG. 4B, if the first MLCS and the second MLCS are assumed to be "a" and "bcdefghi", respectively, the DCSP1 has "ab" and "cdefghi" as its first DCS and second DCS, respectively; the DCSP3, as a final DCSP, has "abcd" and "efghi" as its first DCS and second DCS, respectively.

It should be noted that the first DCS and the second DCS listed in the DCSP table should have corresponding codewords, respectively, in the codeword dictionary. In other words, if there is no corresponding codeword for either the first DCS or the second DCS, neither the first DCS nor the second DCS can be listed in the DCSP table.

The CRD evaluation circuit 150 evaluates a compression rate deviation (CRD) between the first MLCS and the second MLCS, thereby providing the first MLCS and the second MLCS as a first string and a second string, respectively, to the codeword providing circuit 170 through a line L16 if a first predetermined CRD evaluation criterion is satisfied; and supplying a reduction string matching command signal to the reduction string matching circuit 160 via a line L15 if the first predetermined CRD evaluation criterion is not satisfied.

In accordance with a preferred embodiment of the present invention, the first predetermined CRD evaluation criterion requires that $(1/TH) \leq (LFMLCS/LSMLCS) \leq TH$, wherein the LFMLCS and LSMLCS are lengths of the first MLCS and the second MLCS, respectively; and the TH is a predetermined positive threshold value ranging from about 2.5 to about 4.

Referring to FIGS. 3A to 3C, there are set forth tables 310, 320 and 330 for use in describing the operation of the data compression apparatus 100 shown in FIG. 1.

For example, referring to FIG. 3A, under the assumption that TH is 2.5, since the LFMLCS is 3 and the LSMLCS is 2, the predetermined CRD evaluation criterion is satisfied. Hence, as listed in the table 310, the CRD evaluation circuit 150 provides "abc" and "de" as a first string and a second string, respectively, to the codeword providing circuit 170.

Referring to FIG. 3B, under the assumption that TH is 2.5, since the LFMLCS is 6 and the LSMLCS is 2, the predetermined CRD evaluation criterion is not satisfied. Hence, the CRD evaluation circuit 150 provides the reduction string matching command signal to the reduction string matching circuit 160. Referring to FIG. 3C, under the assumption that TH is 2.5, since the LFMLCS is 2 and the LSMLCS is 6, the predetermined CRD evaluation criterion is not satisfied. Hence, the CRD evaluation circuit 150 provides the reduction string matching command signal to the reduction string matching circuit 160.

The reduction string matching circuit 160, in response to the reduction string matching command signal, performs a reduction string matching based on the DCSP table accessed through a line L14 to thereby select a DCSP as a selected DCSP having a first string and a second string among the DCSP's listed in the DCSP table to thereby provide the first string and the second string to the codeword providing circuit 170 through a line L18, wherein a CRD between the first string and the second string satisfies a second predetermined CRD evaluation criterion.

In accordance with a preferred embodiment of the present invention, the second predetermined CRD evaluation criterion requires that (LFDCS/LSDCS) for the selected DCSP has a value equal to or nearest to 1 among (LFDCS/LSDCS) 's for all of the DCSP's listed in the DCSP table, wherein the LFDCS and the LSDCS are lengths of a corresponding first string and a corresponding second string, respectively.

For example, referring back to FIGS. 4A and 4B, as easily understood by referring to the tables 410 and 430, a DCSP2 in the table 410 and a DCSP3 in the table 430 are selected as selected DCSP's, respectively.

The codeword providing circuit 170, based on the codeword dictionary accessed via a line L19, selects a first codeword and a second codeword corresponding to the first string and the second string, respectively, inputted thereto either from the reduction string matching circuit 160 through the line L18 or from the CRD evaluation circuit 150 through the line L16, to thereby provide the first codeword and the second codeword to the encoder 180.

The encoder 180 encodes the first codeword and the second codeword, thereby generating an encoded first codeword and an encoded second codeword, respectively. The encoded first codeword and the encoded second codeword are transmitted to a transmitter (not shown) for the transmission thereof.

Figure 2:
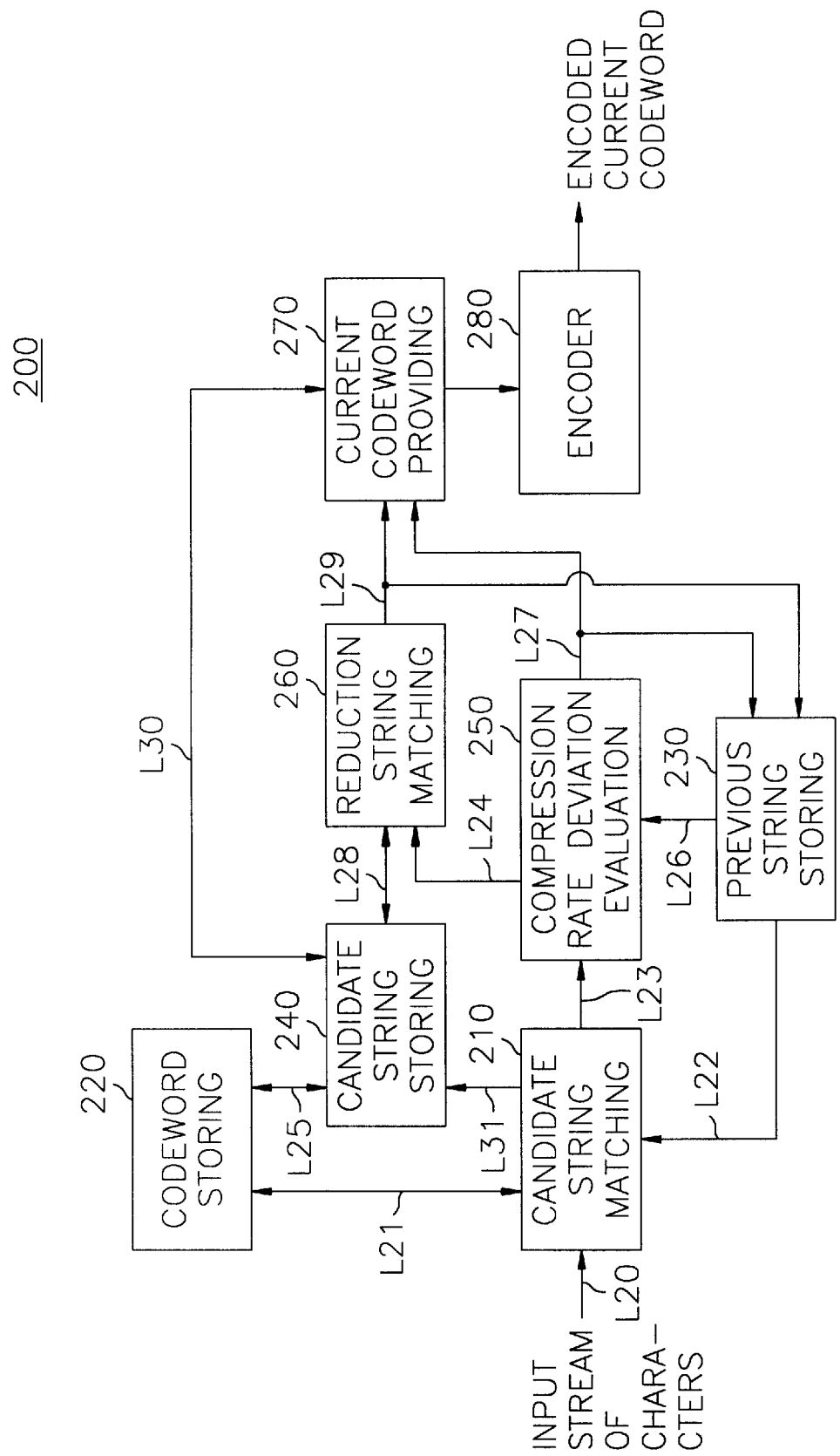
FIG. 2 represents a data compression apparatus for compensating a deviation of a compression rate of an input stream of characters in accordance with another preferred embodiment of the present invention.

Meanwhile, referring to FIG. 2, there is shown a block diagram of a data compression apparatus 200 for compensating a deviation of a compression rate of an input stream of characters in accordance with another preferred embodiment of the present invention.

The apparatus 200 comprises a candidate string matching circuit 210, a codeword storing circuit 220, a previous string storing circuit 230, a candidate string storing circuit 240, a compression rate deviation (CRD) evaluation circuit 250, a reduction string matching circuit 260, a codeword providing circuit 270 and an encoder 280.

In the apparatus 200, an input stream of characters, e.g., alphabets, is first fed to the candidate string matching circuit 210 via a line L20. The codeword storing circuit 220 stores a codeword corresponding to a string of characters to thereby provide a codeword dictionary having a plurality of codewords different from each other, wherein each codeword identifies a corresponding one of the strings.

The previous string storing circuit 230 stores a previous string to thereby provide the previous string to the candidate string matching circuit 210 and the candidate storing circuit 240 via lines L21 and L25, respectively. It should be noted that the previous string represents a string located just before the MLCS inputted to the CRD evaluation circuit 250 within the input stream of characters.

The candidate string matching circuit 210, based on the codewords in the codeword dictionary accessed through a line L21 and a previous string fed thereto from the previous string storing circuit 230 via a line L22, performs a candidate string matching on the input stream of characters in accordance with a predetermined string matching technique to thereby provide candidate strings to the candidate string storing circuit 240 via a line L31 and a maximum length candidate string (MLCS) to the CRD evaluation circuit 250 via a line L23, wherein each candidate string is a string having a corresponding codeword in the codeword dictionary and the MLCS is a candidate string having a longest character length thereof among all of the candidate strings.

In accordance with the predetermined string matching technique, the candidate string matching circuit 210 performs the candidate string matching starting from a starting character, wherein the starting character is a next character of a last character of the previous string within the input stream of characters.

In accordance with the predetermined string matching technique, in case that there is no codeword for the starting character, the candidate string matching circuit 210 registers a codeword corresponding to the starting character into the codeword dictionary through the line L21 to thereby provide an updated codeword dictionary having the codeword corresponding thereto as the codeword dictionary.

FIGS. 5A and 5B depict tables 510 and 530 for use in describing the operation of the data compression apparatus 200 represented in FIG. 2. For example, referring to FIG. 5A, since a previous string is "a" in the table 510, the candidate string matching circuit 210 performs the candidate string matching starting from a starting character, i.e "b", in an input stream of characters as indicated by an arrow therein. In FIG. 5B, since a previous string is "bcd" in the table 530, the candidate string matching circuit 210 performs the candidate string matching starting from a starting character, i.e, "e", in an input stream of characters as indicated by an arrow therein.

Further, in accordance with the predetermined string matching technique, in case that the MLCS includes N number of characters, N being a positive integer, the candidate string matching circuit 210 supplies a first to an Nth candidate strings to the candidate string storing circuit 240, wherein an ith candidate string contains a first to an ith character of the MLCS, i being a positive integer ranging from 1 to N.

The candidate string storing circuit 240 as a candidate string table generation circuit, based on the candidate strings fed thereto from the candidate string matching circuit 210 with reference to the codeword dictionary accessed through a line L25, stores the candidate strings and codewords corresponding thereto, thereby generating a candidate string table listing the candidate strings and the codewords corresponding thereto. Referring to FIG. 6, there is presented a candidate string table 610 generated by the candidate string storing circuit 240 represented in FIG. 2.

The CRD evaluation circuit 250 evaluates a CRD between the MLCS and the previous string, thereby providing the MLCS as a current string to the current codeword providing circuit 270 and the previous string storing circuit 230 through a line L27 if a predetermined CRD evaluation criterion is satisfied and supplying the MLCS and the previous string to the reduction string matching circuit 260 via a line L24 if the predetermined CRD evaluation criterion is not satisfied.

In accordance with the preferred embodiment of the present invention, the predetermined CRD evaluation criterion requires that 0<(LMLCS/LPS)≦TH, wherein the LMLCS and LPS are lengths of the MLCS and the previous string, respectively; and the TH is a predetermined positive threshold value ranging from about 2.5 to about 4.

For example, referring back to FIG. 5B, under the assumption that TH is 3, since the LMLCS is 2 and the LPS is 3, the predetermined CRD evaluation criterion is satisfied. Hence, the CRD evaluation circuit 250 provides an MLCS, i.e., "ef", as a current string as listed in the table 530. Referring back to FIG. 5A, under the assumption that TH is 3, since the LMLCS is 4 and the LPS is 1, the predetermined CRD evaluation criterion is not satisfied. Hence, the CRD evaluation circuit 250 supplies an MLCS, i.e., "bcde", and a previous string, i.e., "a", to the reduction string matching circuit 260.

The reduction string matching circuit 260, based on the MLCS and the previous string fed thereto from the CRD evaluation circuit 250 with reference to the candidate string table through a line L28, performs a reduction string matching to select an optimum candidate string among the candidate strings listed in the candidate string table in accordance with a predetermined optimum candidate string selection rule, thereby providing the optimum candidate string as a current string to the current codeword providing circuit 270 and the previous string storing circuit 230 via a line L29.

In accordance with a preferred embodiment of the present invention, the reduction string matching circuit 260 compares corresponding values of (LCS/LPS)'s for the candidate strings to each other to thereby select a candidate string having a corresponding value of (LCS/LPS) nearest to the TH as the optimum candidate string, wherein the LCS represents a length of a candidate string.

For example, it is assumed that under the condition that Th is 3, "bcde" and "a" are fed to the reduction string matching circuit 260 from the CRD evaluation circuit 250 as a MLCS and a previous string, respectively, as illustrated within the table 510 in FIG. 5A. Under the above mentioned assumption, a candidate string table 610 as shown in FIG. 6 is generated by the candidate string storing circuit 240.

In this case, the reduction string matching circuit 260 selects "bcd" as an optimum candidate string since a corresponding value , i.e, (3/1), of (LCS/LPS) for the "bcd" becomes same to the TH, i.e., 3.

It should be noted that the previous string storing circuit 230 substitutes the previous string previously stored therein with the current string fed thereto from either the reduction string matching circuit 260 or the CRD evaluation circuit 250 to prepare the current string as an updated previous string for a subsequent string.

The current codeword providing circuit 270 selects a current codeword corresponding to the current string fed thereto from either the reduction string matching circuit 260 or the CRD evaluation circuit 250 based on the candidate string table accessed through a line L30 to thereby provide the current codeword to the encoder 280. It should be noted that in accordance with another preferred embodiment of the present invention, the current codeword providing circuit

270 selects a current codeword corresponding to the current string based on the codeword dictionary.

The encoder 280 encodes the current codeword to thereby generate an encoded current codeword. The encoded current codeword is then transmitted to a transmitter (not shown) for the transmission thereof.

While the present invention has been described with respect to certain preferred embodiments only, other modifications and variations may be made without departing from the spirit and scope of the present invention as set forth in the following claims.

What is claimed is:

1. A data compression apparatus for compensating a deviation of a compression rate of an input stream of characters, comprising:

means for storing a codeword corresponding to a string of characters to thereby provide a codeword dictionary having a plurality of different codewords for strings, wherein each codeword identifies a corresponding one of the strings;

means, based on the codewords in the codeword dictionary, for performing a candidate string matching on the input stream of characters in accordance with a predetermined string matching technique to thereby provide a first maximum length candidate string (MLCS) and a second MLCS immediately following the first MLCS, wherein each of the first MLCS and the second MLCS is a candidate string having a longest character length thereof among all of the candidate strings having corresponding codewords in the codeword dictionary, respectively;

means, based on the codeword dictionary, the first MLCS and the second MLCS, for generating derived candidate string pairs (DCSP's) to thereby store a DCSP table listing the DCSP's, each DCSP having a first derived candidate string (DCS) and a second DCS, said each DCSP being generated in accordance with a predetermined DCSP generation rule;

means for evaluating a compression rate deviation (CRD) between the first MLCS and the second MLCS, thereby providing the first MLCS and the second MLCS as a first string and a second string, respectively, if a first predetermined CRD evaluation criterion is satisfied; and supplying a reduction string matching command signal if the first predetermined CRD evaluation criterion is not satisfied; and means, in response to the reduction string matching command signal, for performing a reduction string matching based on the DCSP table to thereby select a DCSP as a selected DCSP having a first string and a second string among the DCSP's listed in the DCSP table, wherein a CRD between the first string and the second string of the selected DCSP satisfies a second predetermined CRD evaluation criterion.

2. The apparatus according to claim 1, further comprising: means for selecting a first codeword and a second codeword corresponding to the first string and the second string based on the codeword dictionary to thereby provide the first codeword and the second codeword, respectively.

3. The apparatus according to claim 2, further comprising: means for encoding the first codeword and the second codeword, thereby generating an encoded first codeword and an encoded second codeword, respectively.

4. The apparatus according to claim 1, wherein, in accordance with the predetermined string matching technique, in case that there is no codeword in the codeword dictionary for a starting character of each of the first candidate string and the second candidate string, said candidate string matching means registers a codeword corresponding to the starting character into the codeword dictionary to thereby provide an updated codeword dictionary having the codeword corresponding thereto as the codeword dictionary.

5. The apparatus according to claim 4, wherein a DCSP generation process in accordance with the predetermined DCSP generation rule is first applied to the first MLCS and the second MLCS by said DCSP table storing means.

6. The apparatus according to claim 5, wherein in case that the DCSP generation process is applied to the first MLCS and the second MLCS, if a length of the first MLCS is equal to or longer than that of the second MLCS, said DCSP table storing means generates a first DCSP DCSP1 having a first DCS and a second DCS, wherein the first DCS is obtained by deleting the last character of the first MLCS; and the second DCS is obtained by attaching the last character of the first MLCS to the second MLCS as a first character thereof.

7. The apparatus according to claim 6, wherein the DCSP generation process is repeatedly applied to a first DCS and a second DCS obtained just before thereof until a final DCSP is obtained, wherein the final DCSP has a first DCS and a second DCS, the length of the first DCS of the final DCSP being equal to that of the second DCS thereof if the total number of characters of the first MLCS and the second MLCS is an even number; and if otherwise, the length of the final DCSP thereof being shorter than that of the second DCS thereof by 1.

8. The apparatus according to claim 7, wherein the first DCS and the second DCS listed in the DCSP table have corresponding codewords, respectively, in the codeword dictionary.

9. The apparatus according to claim 4, wherein said first predetermined CRD evaluation criterion requires that $(1/TH) \leq (LFMLCS/LSMLCS) \leq TH$, wherein the LFMLCS and LSMLCS are lengths of the first MLCS and the second MLCS, respectively; and the TH is a predetermined positive threshold value ranging from 2.5 to 4.

10. The apparatus according to claim 9, wherein the second predetermined CRD evaluation criterion requires that (LFDCS/LSDCS) for the selected DCSP has a value equal to or nearest to 1 among (LFDCS/LSDCS)'s for all of the DCSP's listed in the DCSP table, wherein the LFDCS and the LSDCS are lengths of a corresponding first string and a corresponding second string, respectively.

11. A data compression apparatus for compensating a deviation of a compression rate of an input stream of characters, comprising:

means for storing a codeword corresponding to a string of characters to thereby provide a codeword dictionary having a plurality of different codewords for strings, wherein each codeword identifies a corresponding one of the strings;

means for storing a previous string to thereby provide the previous string;

means, based on the codewords in the codeword dictionary and the previous string, for performing a candidate string matching on the input stream of characters in accordance with a predetermined string matching technique to thereby provide candidate strings and a maximum length candidate string (MLCS), wherein each candidate string is a string having a corresponding codeword in the codeword dictionary and the MLCS is a candidate string having a longest character length thereof among all of the candidate strings;

means, based on the candidate strings with reference to the codeword dictionary, for storing the candidate strings and codewords corresponding thereto, thereby generating a candidate string table listing the candidate strings and the codewords corresponding thereto;

means for evaluating a compression rate deviation (CRD) between the MLCS and the previous string, thereby providing the MLCS as a current string if a predetermined CRD evaluation criterion is satisfied and supplying the MLCS and the previous string if the predetermined CRD evaluation criterion is not satisfied; and means, based on the MLCS and the previous string with reference to the candidate string table, for performing a reduction string matching to select an optimum candidate string among the candidate strings listed in the candidate string table in accordance with a predetermined optimum candidate string selection rule, thereby providing the optimum candidate string as a current string.

12. The apparatus according to claim 11, further comprising:

means for selecting a current codeword corresponding to the current string based on either the candidate string table or the codeword dictionary to thereby provide the current codeword.

13. The apparatus according to claim 12, further comprising:

means for encoding the current codeword to thereby generate an encoded current codeword.

14. The apparatus according to claim 11, wherein said previous string storing means substitutes the previous string previously stored therein with the current string to prepare the current string as an updated previous string for a subsequent string.

15. The apparatus according to claim 14, wherein in accordance with the predetermined string matching technique, said candidate string matching means performs the candidate string matching starting from a starting character, wherein the starting character is a next character of a last character of the previous string within the input stream of characters.

16. The apparatus according to claim 15, wherein in accordance the said predetermined string matching technique, in case that there is no codeword in the codeword dictionary for the starting character, said candidate string matching means registers a codeword corresponding to the starting character into the codeword dictionary to thereby provide an updated codeword dictionary having the codeword corresponding thereto as the codeword dictionary.

17. The apparatus according to claim 16, wherein in accordance with the predetermined string matching technique, in case that the MLCS includes N number of characters, N being a positive integer, said candidate string matching means supplies first to Nth candidate strings, wherein an ith candidate string contains first to ith character of the MLCS, i being a positive integer ranging from 1 to N.

18. The apparatus according to claim 11, wherein said predetermined CRD evaluation criterion requires that $0<(LMLCS/LPS) \leq TH$, wherein the LMLCS and LPS are lengths of the MLCS and the previous string, respectively; and the TH is a predetermined positive threshold value ranging from 2.5 to 4.

19. The apparatus according to claim 18, wherein in accordance with said predetermined optimum candidate string selection rule, said reduction string matching means compares corresponding values of (LCS/LPS)'s for the candidate strings to each other to thereby select a candidate string having a corresponding value of (LCS/LPS) nearest to the TH as the optimum candidate string, wherein an LCS represents a length of a candidate string.

20. The apparatus according to claim 19, wherein the characters are alphabets, respectively.

* * * * *